United States Patent [19]

Clark, II et al.

[11] Patent Number: 4,891,606

[45] Date of Patent: Jan. 2, 1990

[54] PHOTOCURRENT COMPENSATION USING ACTIVE DEVICES

[75] Inventors: Jack E. Clark, II; Jeffrey C. Lee; Brent R. Doyle, all of Palm Bay, Fla.

[73] Assignee: Harris Corporation, Melbourne, Fla.

[21] Appl. No.: 307,944

[22] Filed: Feb. 9, 1989

[51] Int. Cl.$^4$ .............................................. H03F 3/08
[52] U.S. Cl. .................................. 330/288; 307/311; 330/277; 330/308
[58] Field of Search ................. 330/59, 288, 308, 277; 323/315, 316; 250/214 C; 307/311

[56] References Cited

U.S. PATENT DOCUMENTS 4,380,741  4/1983  Mazgy .................................. 330/308

Primary Examiner—James B. Mullins
Attorney, Agent, or Firm—Barnes & Thornburg

[57] ABSTRACT

A current mirror having an amplification factor K providing a photocurrent compensation current to a node having a mismatch of junction photocurrent. The load device on the input leg of the current mirror has an area 1/K times the device width of the larger device junction area at the node and a device width ratio with drive device of the input leg of a current mirror equal to the ratio of mismatch J at the node.

8 Claims, 2 Drawing Sheets $P_X > N_X$ $N_X > P_X$

PHOTOCURRENT COMPENSATION USING ACTIVE DEVICES

BACKGROUND AND SUMMARY OF THE INVENTION

The present invention relates to photocurrent compensation schemes and more specifically to an active photocurrent compensation scheme.

Transient radiation disrupts a circuit by either power supply rail span collapse or false charging or discharging of critical circuit nodes due to large amounts of photocurrent. This photocurrent is directly proportional to dose rate and collection volume (junction area). Supply rail span collapse can be avoided to a certain extent by proper design and layout of the power and ground network.

Circuit nodes most sensitive to photocurrent charging or discharging are those with a large mismatch between N+ to P well and P+ to substrate junction areas. Nodes with more P+ to substrate area will tend to charge to VCC And nodes with more N+ to P well area will tend to charge to GND. Examples of these types of nodes in a memory circuit are: bitlines (much more N+ than P+), I/O lines, preamplifier data read lines, and dynamic NOR or NAND gates.

The easiest way to compensate mismatched nodes is to add the appropriate amount of N+ or P+ junction area to ensure no net photocurrent charges or discharges the node. Unfortunately, this "area compensation" would in some cases double the capacitance on these nodes. Junction area compensation on the bitlines of a 16K memory would add four to six nanoseconds to the access and a large amount of die area would be required.

Thus, it is an object of the present invention to compensate for photocurrents without static area compensation.

Another object of the present invention is to compensate for photocurrents using active devices which do not affect the characteristics of the circuit when photocurrents are not present.

These and other objects are achieved by a photocompensating circuit which includes a current mirror that provides a photocompensating current to a node only when photocurrents are present. In a circuit where the photocurrent associated with the junction area of a first conductivity type is greater by a factor of J than the photocurrent associated with the junction area of a second conductivity type, the junction forms the load of the output leg of the current mirror. The current mirror includes a first and second transistor of the second conductivity type connected to each other to form a current mirror. The second transistor, which is the output transistor, is connected to the node and has a device width K times the device width of the first transistor, which is the input transistor. Thus, the current mirror has an amplification factor of K. A third transistor which forms the load transistor for the input leg of the current mirror is connected to the first transistor. The third transistor has a device width of 1/K times the first conductivity type device width at the node. The device width of the third transistor is also J times the device width of the first transistor. Thus, the current mirror provides a current at the node to compensate for the net photocurrent at the node due to junction photocurrent mismatch.

The transistors may be field effect transistors and the junction area is the drain-to-body junction area. Also, the transistors may be bipolar transistors and the junction area of concern is the collector-base junction area. The circuit may include a clamp connected to the first transistor for maintaining the current mirror off when there is no photocurrent present.

Other objects, advantages and novel features of the present invention will become apparent from the following detailed description of the invention when considered in conjunction with the accompanying drawings.

DETAILED DESCRIPTION OF THE DRAWINGS

Figure 1:
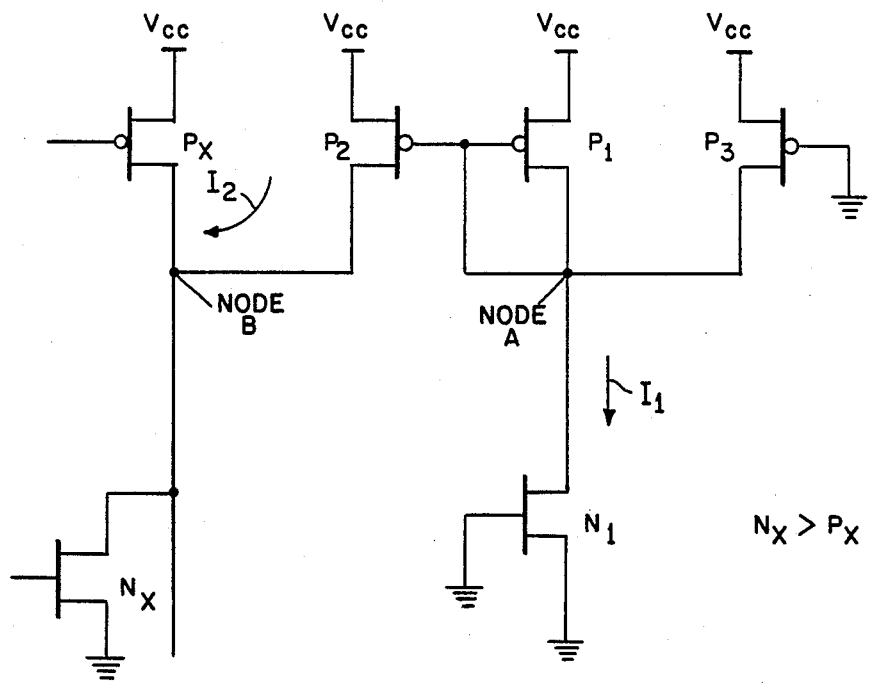
FIG. 1 is a schematic of a photocurrent compensation circuit for field effect transistors according to the principles of the present invention.

For sake of example, the present invention will be described in FIG. 1 with respect to field effect transistors. A field effect transistor NX represents the total amount of the N+ junction area of the circuitry at the drain-body junction at node B for the circuitry connected to node B, and PX represents the total amount of P+ junction area of all the P devices at the drain-to-body junction at node B. It will be assumed for this example that the sum of the junction area of NX is larger than the sum of the junction area of PX by a factor of J. Thus, when the circuit receives radiation, the net photocurrent would be a current being drawn by the substantially larger NX junction.

The compensation circuit is illustrated as a current mirror including a pair of P-type field effect transistors P1 and P2 connected in a current mirror configuration. The output device P2 of the current mirror has its source/drain path connected between a first reference source in the circuit (typically $V_{DD}$) and the node B, while the input transistor P1 has its source/drain path connected between the first reference source (typicall $V_{DD}$) and node A. The gates of the respective devices are connected together and the drain of the input transistor P1. A load transistor N1 of the same conductivity type as the larger or misbalance of the junction area at node B, has its source/drain path connected between node A and a second reference source (typically $V_{SS}$) and its gate connected to the second reference source (typically $V_{SS}$).

A small clamp, consisting of a transistor P3, having a source/drain path connected to node A and the second reference source and its gate connected to the second reference source, maintains the node A at $V_{CC}$ and the current mirror off or $I_2=0$ when photocurrents are not present. Transistor P3 could also be replaced by a high value resistor.

The size or device widths of the devices P1, P2 and N1 are selected so as to provide an appropriate amplification factor as well as providing the exact compensation current needed to compensate or cancel the net photocurrents produced at node B by PX and NX. The size or device width of N1 is selected to be 1/K times the size or device width of the total devices NX at node B. The size or device width of P2 is selected to be K times the size or device width of P1 such that the current mirror has an amplification factor of K. The device width of N1 is also selected to be J times the device width of P1 such that it mirrors the relationship between NX and PX. Thus, the current I1 produced by photocurrents in N1 with respect to P1 will be proportional by a factor of K to the net photocurrent at node B produced by PX and NX. The current mirror with the amplification factor K produces a current I2 which is KI1 at node B to therefore compensate for the photocurrent produced by the mismatch of NX and PX.

Under normal conditions, P3 is on and acts as a clamp to bring node A to a first reference source VCC. This prevents the current mirror from operating and I1 is equal to I2 which is zero. During transient radiation, node A is pulled down below VCC due to a net photocurrent discharge at node A. The voltage at node A falls until the current supplied by P1 and to a much lesser extent P3 cancels the N1 photocurrent. This resulting photocurrent, through the amplification factor of the current mirror, provides the appropriate compensating or cancellation current I2 to node B. Since I2 supplies only enough current to offset the photocurrent, the device P2 will not override any active device on node B nor detrimentally affect its operation in the absence of photocurrents.

Although the example illustrated in FIG. 1 is where NX is larger than PX, it maY also be applied where PX has a junction area greater than NX. In such a case, the current mirror would include appropriately connected N-channel devices with a P-channel load.

Figure 2:
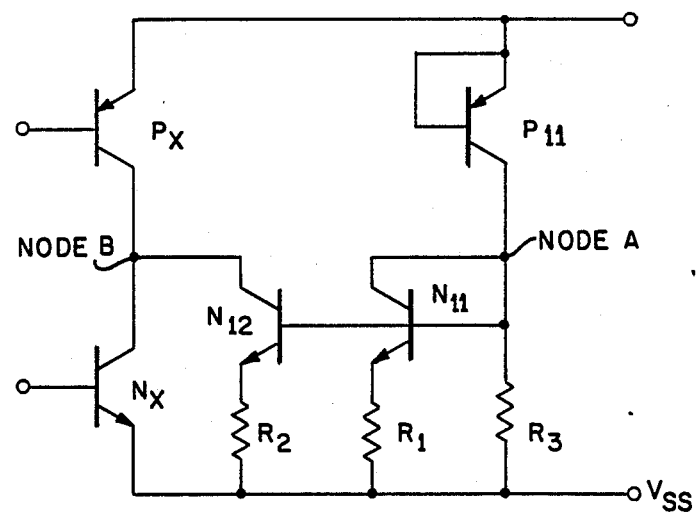
FIG. 2 is a schematic of a photocurrent compensation circuit for bipolar transistors with a larger P collector-to-base photocurrent.

The application of the present invention to bipolar devices is illustrated in FIG. 2 for the P collector to N base junction area for PX is substantially greater than the N collector to P base junction area of the circuitry of NX at node B. The compensation circuit includes a current mirror having input devices N11 and output devices N12 having their bases connected together and their emitters connected toa common terminal $V_{DD}$ through emitter-resistors R1 and R2 respectively. The collector of N12 is connected to node B while the collector of N11 is connected to its base (node A). A large value resistor R3 also connects the common bases of N11 and N12 to the common node VSS. The purpose of the resistor R3 is to insure N11 and N12 are off when no photocurrent is flowing. R1 is chosen to be a large value so that the amount of photocurrent that must flow through it to turn on N11 and N12 is small. A load device P11 having its emitter-collector path connected to the collector base of N11 also has its base connected to its emitter. The size of the device P11 is 1/K of the representative device PX and the current mirror N11/N12 has an amplification factor of K. Also, the ratio of the sizes or device width of P11 to N11 is equal to PX to NX. Thus, the device of FIG. 2 operates as that of FIG. 1 wherein for photocurrents produced in P11, a compensation current is produced by N11 which is amplified by the current mirror and is provided to node B to compensate for the net photocurrents produced by PX and NX.

Figure 3:
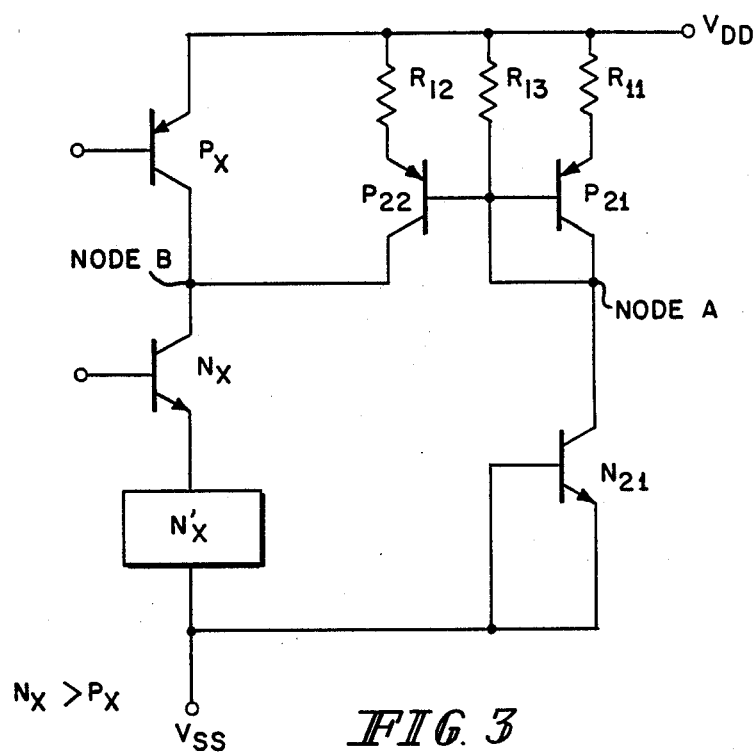
FIG. 3 is a schematic of a photocurrent compensation circuit for a bipolar transistor with a larger N collector-to-base photocurrent.

FIG. 3 shows a similar bipolar circuit wherein the N collector to P base of the NPN transistor as represented by NX and is larger than the P collector to N base of the circuitry PX at node B. It should also be noted that an additional circuitry of N'X is shown in the emitter circuit of NX. The presence of "other circuitry" between the emitters (or sources for MOS cases) and the $V_{DD}$ or $V_{SS}$ supply does not affect the usefulness or validity of this compensation technique. We are addressing an approach to make the net photocurrent into any given node (node B in these examples) zero. The current mirror includes transistors P21 and P22 with the output device P22 connected to node B and the input device P21 connected to a load NPN transistor N21. Resistors R11 and R12 are emitter load resistors (for better current ratio accuracy) and R13 connects the common bases for P21 and P22 to the common voltage source VDD. The ratio of the devices are that discussed above for FIGS. 1 and 2. The photocurrents produced by N21 are supplied by a current from P21. This current is amplified by a factor of K through P22 to node B so as to compensate for the net photocurrents produced by the mismatch between NX and PX.

Thus, it can be seen that the active photocurrent compensation of the present invention provides photocurrent compensation which is easily laid out and consumes a minimal amount of die space. This scheme does not introduce large loads on the nodes being controlled and therefore does not adverselY affect the speed as compared to the area compensation techniques.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. A photocurrent compensation circuit for a node having a greater photocurrent related to the junction area of a first conductivity type devices than a second conductivity type devices by a factor of J, comprising:
   first and second transistors of said second conductivity type connected to each other to form a current mirror, said second transistor, which is an output transistor connected to said node, has a device width which is a factor of K times the device width of said first transistor, which is an input transistor, so that said current mirror has an amplification factor K; and
   third transistor of said first conductivity type connected as a load to said first transistor, said third transistor having a device width 1/K times the first conductivity type device width at said node and having a junction photocurrent J times the junction photocurrent of said first transistor so that the current mirror provides a current at said node to compensate for net photocurrent at said node due to junction photocurrent mismatch.

2. A photocurrent compensation circuit according to claim 1, wherein said transistors are field effect transistors and said junction area is the drain-to-body junction.

3. A photocurrent compensation circuit according to claim 2, wherein said first and second transistors have their gates connected to each other and to a drain of said first transistor, said second transistor has its drain connected to said node and said third transistor has its drain connected to the drain of said first transistor.

4. A photocurrent compensation circuit according to claim 1, including clamping means connected to said first transistor for maintaining said current mirror off when no photocurrents are present.

5. A photocurrent compensation circuit according to claim 4, wherein said clamping means includes a fourth transistor of said second conductivity type connected to said first transistor and having a very high on resistance such that the current that flows through it is very low compared to the photocurrent of interest.

6. A photocurrent compensation circuit according to claim 1, wherein said transistors are bipolar transistors and said junction area is the collector-to-base junction.

7. A photocurrent compensation circuit according to claim 6, wherein said first and second transistors have their base connected to each other and to a collector of said first transistor, said second transistor has its collector connected to said node and said third transistor has its collector connected to the collector of said first transistor.

8. A photocurrent compensation circuit according to claim 7, wherein the emitters of said first and second transistors are connected together at a second node by series emitter resistors and a load resistor larger than said emitter resistors connects said bases of said first and second transistors to said second node.

* * * * *